United States Patent
Akiyama et al.

(10) Patent No.: US 7,833,878 B2
(45) Date of Patent: Nov. 16, 2010

(54) METHOD FOR MANUFACTURING SOI SUBSTRATE

(75) Inventors: Shoji Akiyama, Annaka (JP); Yoshihiro Kubota, Annaka (JP); Atsuo Ito, Annaka (JP); Makoto Kawai, Annaka (JP); Yuuji Tobisaka, Annaka (JP); Koichi Tanaka, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/162,134

(22) PCT Filed: Feb. 8, 2007

(86) PCT No.: PCT/JP2007/052235
§ 371 (c)(1),
(2), (4) Date: Jul. 25, 2008

(87) PCT Pub. No.: WO2007/094232
PCT Pub. Date: Aug. 23, 2007

(65) Prior Publication Data
US 2009/0061591 A1  Mar. 5, 2009

(30) Foreign Application Priority Data
Feb. 16, 2006  (JP)  ............... 2006-039519

(51) Int. Cl.
*H01L 21/30* (2006.01)
(52) U.S. Cl. ............... 438/455; 438/458; 257/E21.32; 257/E21.568
(58) Field of Classification Search ............... 438/311, 438/406, 455, 458; 257/E21.32, E21.568
See application file for complete search history.

(56) References Cited

U.S. PATENT DOCUMENTS 5,013,681 A * 5/1991 Godbey et al. ............... 438/459

(Continued)

FOREIGN PATENT DOCUMENTS

JP   3048201   6/2000

(Continued)

OTHER PUBLICATIONS

Iwata, Hiroyuki et al., "Analysis of platelet distribution in H ion-implanted silicon", Journal of Crystal Growth, vol. 210, No. 1-3, pp. 94-97, (2000).

(Continued)

*Primary Examiner*—Khiem D Nguyen
(74) *Attorney, Agent, or Firm*—Oblon, Spivak, McClelland, Maier & Neustadt, L.L.P.

(57) ABSTRACT

A hydrogen ion-implanted layer is formed on the surface side of a first substrate which is a single-crystal silicon substrate. At least one of the surface of a second substrate, which is a transparent insulating substrate, and the surface of the first substrate is subjected to surface activation treatment, and the two substrates are bonded together. The bonded substrate composed of the single-crystal Si substrate and the transparent insulating substrate thus obtained is mounted on a susceptor and is placed under an infrared lamp. Light having a wave number range including an Si—H bond absorption band is irradiated at the bonded substrate for a predetermined length of time to break the Si—H bonds localized within a "microbubble layer" in the hydrogen ion-implanted layer, thereby separating a silicon thin film layer.

4 Claims, 2 Drawing Sheets

U.S. PATENT DOCUMENTS

| | | | |
|---|---|---|---|
| 5,863,830 A * | 1/1999 | Bruel et al. | 438/478 |
| 5,966,620 A | 10/1999 | Sakaguchi et al. | |
| 6,048,411 A * | 4/2000 | Henley et al. | 148/33.5 |
| 6,225,192 B1 * | 5/2001 | Aspar et al. | 438/460 |
| 6,263,941 B1 | 7/2001 | Bryan et al. | |
| 6,309,945 B1 * | 10/2001 | Sato et al. | 438/409 |
| 6,323,108 B1 * | 11/2001 | Kub et al. | 438/458 |
| 6,372,608 B1 * | 4/2002 | Shimoda et al. | 438/455 |
| 6,486,008 B1 * | 11/2002 | Lee | 438/149 |
| 6,513,564 B2 | 2/2003 | Bryan et al. | |
| 6,582,999 B2 | 6/2003 | Henley et al. | |
| 2004/0029358 A1 * | 2/2004 | Park et al. | 438/458 |
| 2004/0248379 A1 | 12/2004 | Maleville et al. | |
| 2005/0266653 A1 * | 12/2005 | Moriwaki | 438/406 |

FOREIGN PATENT DOCUMENTS

| | | |
|---|---|---|
| JP | 2001 244444 | 9/2001 |
| JP | 2002 118242 | 4/2002 |
| JP | 2005 142524 | 6/2005 |

OTHER PUBLICATIONS

Auberton-Herve, A.-J. et al., "Smart Cut Technology: Industrial Status of Soi Wafer Production and New Material Developments", Electrochemical Society Proceedings, vol. 99-3, pp. 93-106, (1999).
U.S. Appl. No. 12/158,047, filed Jun. 19, 2008, Kawai, et al.*
U.S. Appl. No. 12/161,819, filed Jul. 23, 2008, Akiyama, et al.*
U.S. Appl. No. 12/161,694, filed Jul. 22, 2008, Akiyama, et al.*
U.S. Appl. No. 12/161,821, filed Jul. 23, 2008, Akiyama, et al.*
U.S. Appl. No. 12/282,176, filed Sep. 9, 2008, Akiyama, et al.*
U.S. Appl. No. 12/281,886, filed Sep. 5, 2008, Akiyama, et al.*

* cited by examiner

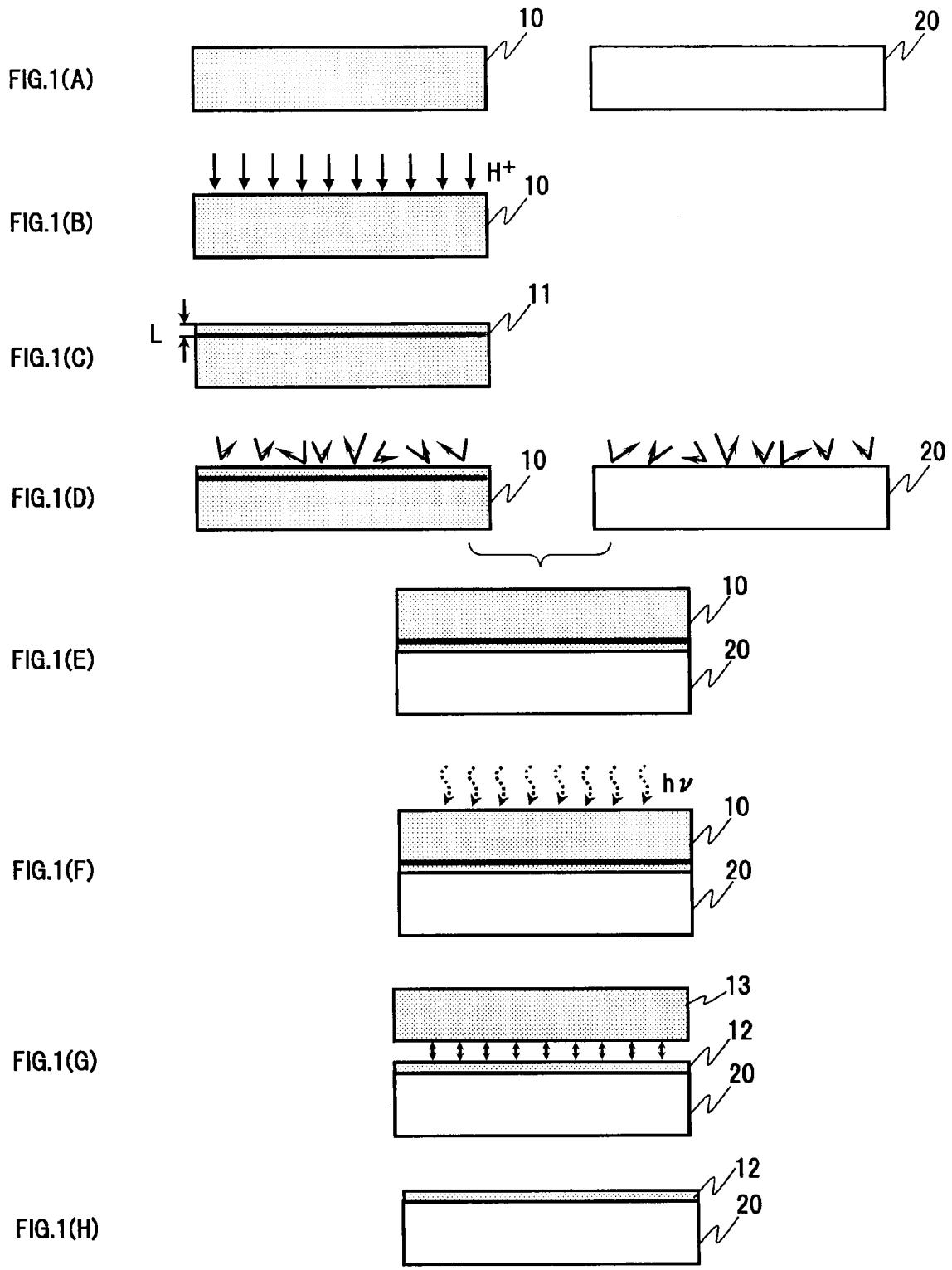

METHOD FOR MANUFACTURING SOI SUBSTRATE

TECHNICAL FIELD

The present invention relates to a method for manufacturing an SOI substrate having a single-crystal silicon thin film on a transparent insulating substrate.

BACKGROUND ART

As a method for manufacturing an SOI substrate, there are known the SmartCut method, the SiGen method, and the like based on conventional bonding.

The SmartCut method is a method in which a silicon substrate, on the bonding side of which hydrogen ions have been implanted, and a substrate made also of silicon or of another material are bonded together and subjected to a heat treatment at a temperature of 400° C. or higher (for example, 500° C.). Then, a silicon thin film is thermally peeled off from a region where the concentration of the implanted hydrogen ions is highest, thus obtaining an SOI substrate (see, for example, Japanese Patent No. 3048201 (patent document 1) and A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) pp. 93-106) (non-patent document 1)).

The SiGen method is a method in which before a silicon substrate, on the bonding side of which hydrogen ions have been implanted, and a substrate made also of silicon or of another material are bonded together, both or either one of the bonding surfaces of these substrates is plasma-treated. The two substrates are then bonded together with the surfaces thereof activated. After heat-treating the bonded substrates at a low temperature (for example, 100 to 300° C.) and thereby increasing the bonding strength thereof, a silicon thin film is mechanically peeled off at room temperature, thus obtaining an SOI substrate (see, for example, the specification of U.S. Pat. No. 6,263,941 (patent document 2), the specification of U.S. Pat. No. 6,513,564 (patent document 3), and the specification of U.S. Pat. No. 6,582,999 (patent document 4)).

The difference between these two methods mainly lies in the process of silicon thin film separation. The SmartCut method requires processing at a high temperature for the purpose of silicon thin film separation, whereas the SiGen method makes this separation feasible at room temperature.

As a rule, a silicon substrate and a substrate made of another material are bonded together in the manufacture of a bonded SOI substrate. These materials of different types generally differ from each other in the rate of thermal expansion, intrinsic allowable temperature limits, and the like. Consequently, if the temperature of heat treatment applied to the substrates being bonded in a manufacturing process becomes higher, the substrates are more likely to cause breakage or local cracks due to a difference in thermal properties between the both substrates. From this point of view, the SmartCut method which requires high temperatures for silicon thin film separation can hardly be said preferable as a method for manufacturing an SOI substrate based on the bonding of substrates made of different materials.

On the other hand, the SiGen method capable of low-temperature separation is less likely to cause breakage or local cracks due to the aforementioned difference in thermal properties. However, this method in which a silicon thin film is peeled off mechanically has the problem that it is more likely that the bonded (jointed) surfaces of the substrates separate from each other, traces of separation arise, or mechanical damage is introduced into the silicon thin film during a separation process.

The present invention has been accomplished in view of the above-described problems. It is therefore an object of the present invention to avoid breakage, local cracks and the like due to a difference in thermal properties between the substrates and the introduction of mechanical damage into an SOI layer in a step of manufacturing an SOI substrate by bonding together a single-crystal silicon substrate and a transparent insulating substrate, thereby providing an SOI substrate having an SOI layer superior in film uniformity, crystal quality, and electrical characteristics (carrier mobility and the like).

DISCLOSURE OF THE INVENTION

In order to solve the above-described problems, a method for manufacturing an SOI substrate in accordance with the present invention includes:

a first step of forming a hydrogen ion-implanted layer on the surface side of a first substrate which is a single-crystal silicon substrate;

a second step of applying a surface activation treatment to at least one of the surface of a second substrate and the surface of the first substrate;

a third step of bonding together the surface of the first substrate and the surface of the second substrate; and a fourth step of forming an SOI layer on the surface of the second substrate by irradiating light having a wave number range including an Si—H bond absorption band at the bonded substrate to peel off a silicon layer from the first substrate.

In the present invention, the fourth step of light irradiation can be carried out by irradiating light having a wave number range including a wave number corresponding to an Si—H bond absorption band of 2200 to 2300 $cm^{-1}$ or an integral multiple of the absorption band.

Further, in the present invention, the second substrate is a transparent insulating substrate, such as a quartz substrate, a sapphire (alumina) substrate, a borosilicate glass substrate, or a crystallized substrate.

In the present invention, the amount of hydrogen ion implantation (dose amount) in the first step is preferably $1 \times 10^{16}$ to $5 \times 10^{17}$ atoms/$cm^2$, and the second step of surface activation treatment can be carried out by means of at least one of plasma treatment and ozone treatment.

Still further, in the present invention, the third step may include a sub-step of heat-treating the first substrate and the second substrate at 100 to 300° C. after the bonding together, with the first and second substrates bonded together.

According to the present invention, a silicon thin film is peeled off by irradiating light having a wavelength range "transparent" to silicon crystals. Therefore, breakage, local cracks and the like due to a difference in thermal properties between the substrates and the introduction of mechanical damage into the silicon thin film peeled off from a surface region of the silicon substrate are avoided. As a result, it is possible to provide an SOI substrate having an SOI layer superior in film uniformity, crystal quality, and electrical characteristics (carrier mobility and the like).

BRIEF DESCRIPTION OF THE DRAWINGS

FIG. 1 is a schematic view used to explain a manufacturing process example of an SOI substrate in accordance with the present invention.

BEST MODE FOR CARRYING OUT THE INVENTION

Figure 2A:
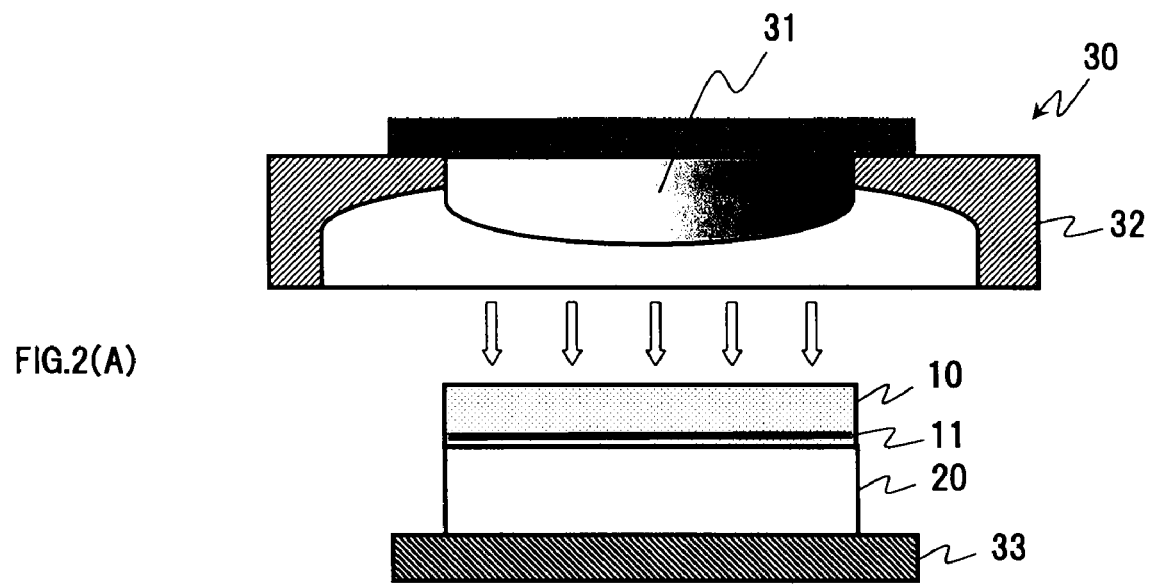
FIG. 2 is a conceptual schematic view used to explain a way of light irradiation for silicon thin film separation.

Hereinafter, the best mode for carrying out the present invention will be described with reference to the accompanying drawings. Note that in the following description, a second substrate used for bonding to a single-crystal silicon substrate, which is a first substrate, is assumed to be an insulating substrate transparent to visible light. However, this second substrate may be a nontransparent non-insulating substrate such as a silicon substrate. In that case, an insulating film, such as an oxide film, is previously formed on a surface of at least one of the first and second substrates and this insulating film is used as an insulating layer of an SOI substrate.

EMBODIMENTS

FIG. 1 is a schematic view used to explain a process example in a method for manufacturing an SOI substrate of the present invention, wherein a first substrate 10 illustrated in FIG. 1(A) is a single-crystal Si substrate and a second substrate 20 is a transparent insulating substrate, such as a quartz substrate, sapphire (alumina) substrate, a borosilicate glass substrate or a crystallized glass substrate.

Here, the single-crystal Si substrate 10 is, for example, a commercially-available Si substrate grown by the Czochralski (CZ) method. The electrical property values, such as the conductivity type and specific resistivity, the crystal orientation, and the crystal diameter of the single-crystal Si substrate 10 are selected as appropriate, depending on the design value and process of a device to which the SOI substrate manufactured using the method of the present invention is devoted or on the display area of a device to be manufactured.

Note that the diameters of these substrates are the same. For the sake of convenience in a subsequent device formation process, it is advantageous to provide the same orientation flat (OF) as the OF provided in the single-crystal Si substrate 10 also in the transparent insulating substrate 20, and bond the substrates together by aligning these OFs with each other.

First, hydrogen ions are implanted into a surface of the first substrate (single-crystal Si substrate) 10, to form a hydrogen ion-implanted layer (FIG. 1(B)). This ion-implanted surface serves as a later-discussed bonding surface (joint surface). As the result of this hydrogen ion implantation, a uniform ion-implanted layer 11 is formed near a surface of the single-crystal Si substrate 10 at a predetermined depth (average ion implantation depth L). In a region at a depth corresponding to the average ion implantation depth L in a surface region of the single-crystal Si substrate 10, there is formed a "microbubble layer" which exists locally in the aforementioned region (FIG. 1(C)).

The depth of the ion-implanted layer 11 from the surface of the single-crystal Si substrate 10 (average ion implantation depth L) is controlled by an acceleration voltage at the time of ion implantation and is determined depending on how thick an SOI layer to be peeled off is desired. For example, the average ion implantation depth L is set to 0.5 μm and ion implantation conditions are specified so that a dose amount is $1 \times 10^{16}$ to $5 \times 10^{17}$ atoms/cm$^2$ and an acceleration voltage is 50 to 100 keV.

Note that an insulating film, such as an oxide film, may be previously formed on the ion-implanted surface of the single-crystal Si substrate 10 and ion implantation may be applied through this insulating film in a process of ion implantation into Si crystal, as is commonly practiced to suppress the channeling of implanted ions.

A plasma treatment or an ozone treatment for the purpose of surface cleaning, surface activation and the like is applied to the respective bonding surfaces of the single-crystal Si substrate 10 in which the ion-implanted layer 11 has been formed and the transparent insulating substrate 20 (FIG. 1(D)). Note that such a surface treatment as described above is performed for the purpose of removing organic matter from a surface serving as a bonding surface or achieving surface activation by increasing surface OH groups. However, the surface treatment need not necessarily be applied to both of the bonding surfaces of the single-crystal Si substrate 10 and the transparent insulating substrate 20. Rather, the surface treatment may be applied to either one of the two bonding surfaces.

When carrying out this surface treatment by means of plasma treatment, a surface-cleaned single-crystal Si substrate to which RCA cleaning or the like has been applied previously and/or a transparent insulating substrate is mounted on a sample stage within a vacuum chamber, and a gas for plasma is introduced into the vacuum chamber so that a predetermined degree of vacuum is reached. Note that examples of gas species for plasma used here include an oxygen gas, a hydrogen gas, an argon gas, a mixed gas thereof, or a mixed gas of oxygen and helium for use in the surface treatment of the single-crystal Si substrate. The gas for plasma can be changed as appropriate according to the surface condition of the single-crystal Si substrate or the purpose of use thereof.

If the surface treatment is performed also for the purpose of oxidizing a single-crystal Si surface, a gas containing at least an oxygen gas is used as the gas for plasma. Note that if a substrate, such as a quartz substrate, the surface of which is in an oxidized state, is used as the transparent insulating substrate, there are no particular restrictions on such selection of a type of gas for plasma as described above. High-frequency plasma having an electrical power of approximately 100 W is generated after the introduction of the gas for plasma, thereby applying the surface treatment for approximately 5 to 10 seconds to a surface of the single-crystal Si substrate and/or a surface of the transparent insulating substrate to be plasma-treated, and then finishing the surface treatment.

When the surface treatment is carried out by means of ozone treatment, a surface-cleaned single-crystal Si substrate to which RCA cleaning or the like has been applied previously and/or a transparent insulating substrate is mounted on a sample stage within a chamber placed in an oxygen-containing atmosphere. Then, after introducing a gas for plasma, such as a nitrogen gas or an argon gas, into the chamber, high-frequency plasma having a predetermined electrical power is generated to convert oxygen in the atmosphere into ozone by the plasma. Thus, a surface treatment is applied for a predetermined length of time to a surface of the single-crystal Si substrate and/or a surface of the transparent insulating substrate to be treated.

The single-crystal Si substrate 10 and the transparent insulating substrate 20, to which such a surface treatment as described above has been applied, are bonded together with the surfaces thereof closely adhered to each other as bonding surfaces (FIG. 1(E)). As described above, the surface (bonding surface) of at least one of the single-crystal Si substrate 10 and the transparent insulating substrate 20 has been subjected to a surface treatment by plasma treatment, ozone treatment or the like and is therefore in an activated state. Thus, it is possible to obtain a level of bonding strength fully resistant to mechanical separation or mechanical polishing in a post-process even if the substrates are closely adhered to each other (bonded together) at room temperature. If the substrates need to have an even higher level of bonding strength, there may be provided a sub-step of applying a "bonding process" by heating the substrates at a relatively low temperature in succession to the "bonding together" illustrated in FIG. 1(E).

The bonding process temperature at this time is selected as appropriate according to the types of substrates to be used for bonding. If the substrate to be bonded to the single-crystal Si substrate is a transparent insulating substrate, such as a quartz substrate, a sapphire (alumina) substrate, a borosilicate glass substrate or a crystallized glass substrate, the temperature is set to 350° C. or lower and, more preferably, within a range from 100 to 300° C.

The reason for selecting the heating temperature of 350° C. or lower in a case where the substrate to be bonded to the single-crystal Si substrate is a transparent insulating substrate (quartz substrate, in particular) is because consideration is given to a difference in thermal expansion coefficient between single-crystal Si and quartz, an amount of strain due to this difference, and a relationship between the amount of strain and the thicknesses of the single crystal Si substrate 10 and the transparent insulating substrate 20.

If the thicknesses of the single-crystal Si substrate 10 and the transparent insulating substrate 20 are almost the same with each other, thermal strain-induced cracks or separation at a bonding plane occurs due to a difference in rigidity between the both substrates when the substrates are subjected to a heat treatment at a temperature higher than 350° C., since there is a significant difference between the thermal expansion coefficient ($2.33 \times 10^{-6}$) of single-crystal Si and the thermal expansion coefficient ($0.6 \times 10^{-6}$) of quartz. In an extreme case, the breakage of the single-crystal Si substrate or the quartz substrate occurs. Accordingly, the upper limit of the heat treatment temperature is specified as 350° C. and a heat treatment is preferably applied within a temperature range of 100 to 300° C.

In succession to such a bonding process as described above, light beams in an infrared region are irradiated at the bonded substrate (FIG. 1(F)). As described above, as the result of hydrogen ion implantation, there is formed a "microbubble layer" which exists locally in a region at a depth corresponding to the average ion implantation depth L and high-density "Si—H bonds" are present in this "microbubble layer."

As the bonding states of Si and H (described as "Si—H"), there are known $SiH$, $SiH_2$, $SiH_3$ and the like, and absorption bands attributable to these bonds are known to be 2280, 2220, and 2200 $cm^{-1}$, respectively (G. Lucovsky, "Chemical effects on the frequencies of Si—H vibrations in amorphous solids" Solid Stat. Commun., 29, 571 (1979) (non-patent document 2)).

On the other hand, an Si crystal is, as a matter of practice, "transparent" to light having a wave number of 2200 to 2300 $cm^{-1}$. No light having the wave number range is, therefore, absorbed by the Si crystal and turns into heat therein to cause substrate temperature rise even if the light is irradiated at the Si crystal.

Accordingly, if light having a wave number range corresponding to an "Si—H bond" absorption band of 2200 to 2300 $cm^{-1}$ is irradiated at a bonded substrate, it is possible to let the light having the wave number range absorbed by "Si—H bonds" and thereby break the bonds without raising the substrate temperature.

Note that in addition to "single-phonon absorption" in which light having a wave number of 2200 to 2300 $cm^{-1}$ is absorbed, the light absorption of "Si—H bonds" involves the absorption of "harmonics" of light having wave numbers equal to integral multiples of this absorption band. Therefore, it is also acceptable to irradiate light having a wave number range including a wave number equal to an integral multiple of an absorption band of 2200 to 2300 $cm^{-1}$ (for example, second order: 4400 to 4600 $cm^{-1}$, third order: 6600 to 6900 $cm^{-1}$, and fourth order: 8800 to 9200 $cm^{-1}$).

Since infrared light generally means light having a wave number range of 14,000 to 20 $cm^{-1}$ (wavelength range of 0.7 to 500 μm), every wave number in the aforementioned wave number range falls within the infrared region.

If such light irradiation as described above is applied, the irradiated light is absorbed by Si—H bonds and the breakage of the Si—H bonds occurs. As a result, the separation of a silicon thin film from single-crystal silicon takes place along a crystal plane at a position corresponding to a predetermined depth (average ion implantation depth L) near the surface of the single-crystal Si substrate 10 (FIG. 1(G)). Thus, there is obtained an SOI layer on the second substrate 20 (FIG. 1(H)).

FIG. 2(A) is a conceptual schematic view used to explain a condition of a light-irradiating section for silicon thin film separation. In this figure, reference numeral 30 denotes the light-irradiating section. The light-irradiating section 30 is provided with an infrared lamp 31 and a lamp house (lamp shade) 32, wherein the inner side surface of the lamp house 32 is gold-coated in order to increase the reflection efficiency of infrared light.

In the present embodiment, a silicon carbide lamp (whose radiation wavelength is 1.0 to 50 μm, which corresponds to a wave number range of 10,000 to 200 $cm^{-1}$) is used as the infrared lamp 31. Alternatively, there may be used a tungsten lamp (whose radiation wavelength is 1.0 to 2.5 μm, which corresponds to a wave number range of 10,000 to 4,000 $cm^{-1}$), a cesium-xenon lamp (whose radiation wavelength is 0.8 to 2.5 μm, which corresponds to a wave number range of 12,500 to 4,000 $cm^{-1}$), a carbon-arc lamp (whose radiation wavelength is 2.0 to 25 μm, which corresponds to a wave number range of 5,000 to 400 $cm^{-1}$), or the like.

A bonded substrate formed of the single-crystal Si substrate 10 and the transparent insulating substrate 20 is mounted on a susceptor 33 and placed under the infrared lamp 31. Then, light irradiation is applied to the bonded substrate for a predetermined length of time to break S—H bonds which localize in a "microbubble layer" within an ion-implanted layer 11. Note that although the material of the susceptor 33 is assumed here to be quartz glass, the material can be changed as appropriate. In consideration of the wave number range of irradiated light, however, it is preferable to select a susceptor made of a material which does not allow the susceptor temperature to rise due to the absorption of irradiated light, thereby preventing any remarkable temperature rise in the bonded substrate.

Figure 2B:
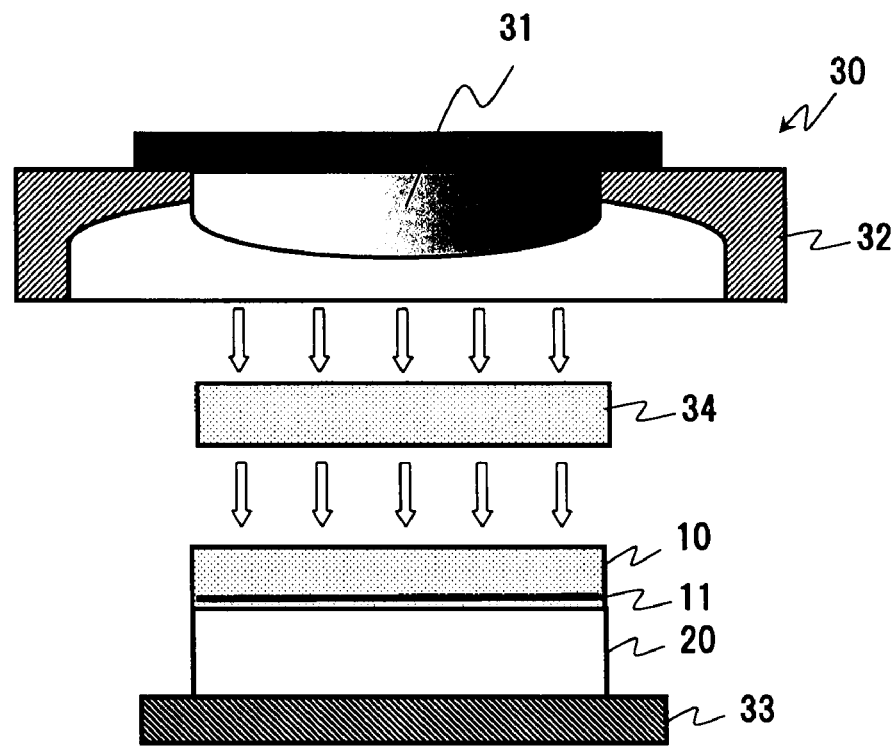

Note that as described above, a silicon crystal is, as a matter of practice, "transparent" to light having a wave number of 2200 to 2300 $cm^{-1}$, as well as to light the wave number of which is an integral multiple of the aforementioned wave number. A wave number range of approximately 500 to 1300 $cm^{-1}$ includes an intrinsic absorption band attributable to "Si—Si bonds" between Si atoms composing the silicon crystal and a light absorption band attributable to "Si—O bonds" caused by the bonding of silicon atoms and interstitial oxygen. If a substrate temperature rise due to such light absorption based on absorption bands as described above is a problem, the susceptor 33 may be provided with a sample-cooling function to avoid the substrate temperature rise. Alternatively, a dummy silicon wafer 34 may be provided between the infrared lamp 31 and the bonded substrate as illustrated in FIG. 2(B), for example, in order to use the dummy silicon wafer 34 as a color filter, thereby irradiating infrared light transmitting through this dummy wafer at the bonded substrate.

If such a dummy wafer 34 as described above is used, infrared absorption specific to silicon crystals takes place within the dummy wafer 34 and, therefore, light absorption by the "Si—Si" bonds specific to silicon crystals no longer takes place for light transmitting through this dummy wafer. Thus, it is possible to avoid causing the substrate temperature rise.

The surface of the SOI layer after separation thus obtained is free from defects, such as the local separation of a silicon thin film, traces of separation and untransferred regions, and exhibits an extremely planar state. Measurement of a 10 μm×10 μm area of the surface of the SOI layer after separation using an atomic force microscope (AFM) showed that the RMS mean value was as excellent as 6 nm or less.

As described above, in the present invention, there is no need for such high-temperature processing and mechanical separation processing as used in conventional methods either in a step of bonding together the single-crystal Si substrate 10 and the transparent insulating substrate 20 or in a step of separating the SOI layer. In addition, it is possible to consistently carry out processing at low temperatures (350° C. or lower for the transparent insulating substrate).

Since many of heretofore known methods for manufacturing an SOI substrate include a high-temperature processing step, there has been the need for special contrivance intended to avoid cracks or separation arising due to thermal strain. On the other hand, the separation process of the present invention requires neither high-temperature processing nor mechanical separation processing. It is therefore possible to provide an SOI substrate having an SOI layer superior in film uniformity, crystal quality and electrical characteristics (carrier mobility and the like). In addition, the separation process is extremely advantageous from the viewpoint of stabilizing and simplifying the manufacturing process of an SOI substrate.

While a method for manufacturing the SOI substrate of the present invention has been described hereinabove with reference to the embodiments thereof, the present invention should not be construed as being limited to the scope described in the embodiments. It is needless to say that the present invention is applicable by appropriately altering substrates to be used, conditions of light irradiation, and the like.

INDUSTRIAL APPLICABILITY

According to the present invention, it is possible to avoid breakage, local cracks and the like due to a difference in thermal properties between substrates and the introduction of mechanical damage into an SOI layer in a step of manufacturing an SOI substrate by bonding together a single-crystal silicon substrate and a transparent insulating substrate. As a result, it is possible to provide an SOI substrate having an SOI layer superior in film uniformity, crystal quality, and electrical characteristics (carrier mobility and the like).

The invention claimed is:

1. A method for manufacturing an SOI substrate, characterized by comprising:
   a first step of forming a hydrogen ion-implanted layer on a surface of a first substrate which is a single-crystal silicon substrate;
   a second step of applying a surface activation treatment to at least one surface of a second substrate and the surface of said first substrate, wherein said second substrate is a transparent insulating substrate which is one of a quartz substrate, a sapphire (alumina) substrate, a borosilicate glass substrate, and a crystallized substrate;
   a third step of bonding together the surface of said first substrate and the surface of said second substrate, and which includes heat-treating said first substrate and said second substrate at 100 to 300° C. after said bonding together, with said first and second substrates bonded together; and
   a fourth step of forming an SOI layer on the surface of said second substrate by irradiating light having a wave number range including an Si—H bond absorption band at said bonded substrate to peel off a silicon layer from said first substrate.

2. The method for manufacturing an SOI substrate according to claim 1, characterized in that said fourth step of light irradiation is carried out by irradiating light having a wave number range including a wave number corresponding to an Si—H bond absorption band of 2200 to 2300 cm$^{-1}$ or an integral multiple of said absorption band.

3. The method for manufacturing an SOI substrate according to claim 1, characterized in that the amount of hydrogen ion implantation (dose amount) in said first step is $1\times10^{16}$ to $5\times10^{17}$ atoms/cm$^2$.

4. The method for manufacturing an SOI substrate according to claim 1, characterized in that said second step of surface activation treatment is carried out by means of at least one of plasma treatment and ozone treatment.

* * * * *